United States Patent
Mochida

(10) Patent No.: US 9,779,800 B2
(45) Date of Patent: Oct. 3, 2017

(54) TIMING CONTROL CIRCUIT SHARED BY A PLURALITY OF BANKS

(71) Applicant: Micron Technology, Inc., Boise, ID (US)

(72) Inventor: Noriaki Mochida, Yokohama (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/245,727

(22) Filed: Aug. 24, 2016

(65) Prior Publication Data
US 2017/0076778 A1 Mar. 16, 2017

Related U.S. Application Data

(60) Provisional application No. 62/219,560, filed on Sep. 16, 2015.

(51) Int. Cl.
*G11C 11/4091* (2006.01)
*G11C 11/408* (2006.01)
*G11C 11/406* (2006.01)
*G11C 11/4076* (2006.01)

(52) U.S. Cl.
CPC ...... *G11C 11/4091* (2013.01); *G11C 11/4076* (2013.01); *G11C 11/4087* (2013.01); *G11C 11/40618* (2013.01)

(58) Field of Classification Search
CPC .......... G11C 11/4091; G11C 11/40618; G11C 11/4076; G11C 11/4087
See application file for complete search history.

(56) References Cited

U.S. PATENT DOCUMENTS

| | | | | |
|---|---|---|---|---|
| 7,486,581 B2* | 2/2009 | Park | ........................ | G11C 7/02 365/196 |
| 8,164,974 B2* | 4/2012 | Hsu | ...................... | G11C 7/1042 365/189.15 |
| 8,213,251 B2* | 7/2012 | Yun | .......................... | G11C 7/08 365/189.11 |
| 9,455,002 B2* | 9/2016 | Kim | ........................ | G11C 7/08 |

FOREIGN PATENT DOCUMENTS

JP H11-203867 A 7/1999

* cited by examiner

*Primary Examiner* — Tri Hoang
(74) *Attorney, Agent, or Firm* — Dorsey & Whitney LLP

(57) ABSTRACT

Apparatuses and methods for providing activation timings of sense amplifiers in a semiconductor device are described. An example apparatus includes: a first memory bank including at least one first sense amplifier that is enabled responsive to a first activation signal; a second memory bank including at least one second sense amplifier that is enabled responsive to a second activation signal; and a control circuit that receives a control signal. The control circuit includes a delay circuit that provides a delayed control signal by delaying the control signal, a first sense amplifier control circuit coupled to the first delay circuit and provides the first activation signal respective to the delayed control signal when the first memory bank is designated, and a second sense amplifier control circuit coupled to the delay circuit and provides the second activation signal respective to the delayed control signal when the second memory bank is designated.

21 Claims, 12 Drawing Sheets

TIMING CONTROL CIRCUIT SHARED BY A PLURALITY OF BANKS

CROSS-REFERENCE TO RELATED APPLICATION(S)

This application is claims priority to U.S. Provisional Application No. 62/219,560, filed Sep. 16, 2015, which is incorporated herein by reference, in its entirety, for any purpose.

BACKGROUND

In the semiconductor memory industry, there is a technical trend of adopting newer architecture with a larger number of memory banks in order to achieve higher access speed. For example, among synchronous dynamic random-access memories (SDRAM), double data rate two (DDR2) SDRAM may include four memory banks. DDR type three (DDR3) SDRAM may include eight memory banks, DDR fourth generation (DDR4) SDRAM may include sixteen memory banks, and DDR4e may include thirty-two memory banks. Development of processes for fine patterns of semiconductor devices so called 1x-nm technology generation or later has been an important theme in order to keep a small size of the semiconductor devices while having a larger number of memory banks. In the 1x-nm technology processes, increasing costs of the processes have been a critical issue. It is, therefore, important to develop devices in a cost-competitive manner by utilizing existing process technologies. One solution to avoid such cost increase may be reducing areas of peripheral circuits while increasing areas for memory cells.

In recent years, there has been an effort to reduce the areas of the peripheral circuits. For example, Japanese patent application publication H11-203867 (JPA H11-203867) describes a row access control circuit to secure a restore level of memory cell by preventing a selected memory cell from being precharged before a lapse of a minimum row active period (tRAS). In particular, the row access control circuit described in JPA H11-203867 includes a single delay circuit which delays an active command to provide a precharge control signal which is used to keep a row access strobe (RAS) signal at an active level. JPA H11-203867 also describes that the single delay circuit is shared by a plurality of memory banks and the precharge control signal is provided selectively to one of the plurality memory banks to control a precharge operation timing for the one of the plurality memory banks. Thus, the precharge timings for the plurality of memory banks can be individually controlled.

DETAILED DESCRIPTION OF PREFERRED EMBODIMENTS

Among peripheral circuits of a semiconductor device, row access strobe (RAS) timing control circuits occupy a significantly large area in the semiconductor device. An increase in the number of memory banks results in an increase in the area used for the RAS timing control circuits because one RAS timing circuit is provided for each memory bank of the plurality of memory banks of the semiconductor device. For example, DDR2 SDRAM may include four RAS timing control circuits, DDR3 SDRAM may include eight RAS timing control circuits, DDR4 SDRAM may include sixteen RAS timing control circuits, and DDR4e may include thirty-two RAS timing control circuits.

As will be described in more detail below, a semiconductor device according to the present disclosure includes a row timing control circuit which may be configured to control timings of a plurality of sense amplifiers in a corresponding plurality of memory banks respectively.

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
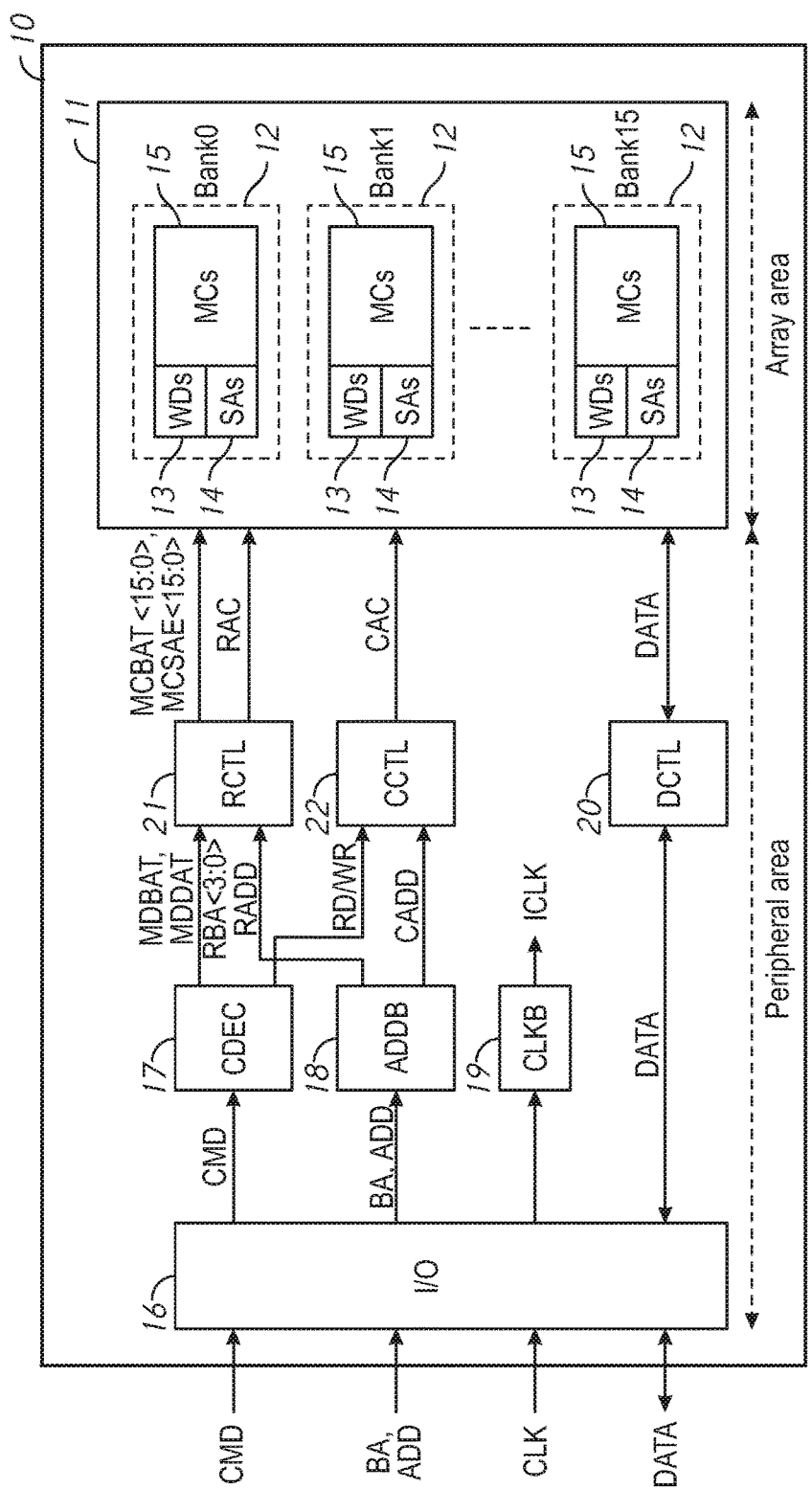
FIG. 1 is a functional block diagram of a semiconductor device in accordance with the present disclosure.

FIG. 1 is a functional block diagram of a semiconductor device in accordance with the present disclosure. The semiconductor device 10 includes a memory cell array 11 that can store data. The memory cell array 11 may be included in an array area. The memory cell array 11 includes a plurality of memory banks 12, including a first bank (Bank0), a second bank (Bank1) . . . and Bank15. The number of the plurality of memory banks in this example is sixteen; however, it is not limited to sixteen. Each memory bank of the plurality of memory banks 12 has a plurality of word line drivers (WDs) 13 and a plurality of sense amplifiers (SAs) 14 and DRAM memory cells (MCs) 15 accessed via bit lines BL and word lines WL driven by the plurality of WDs 13.

The semiconductor device 10 includes several circuits in a peripheral area outside of the array area. An input/output (I/O) circuit 16 is coupled to external devices. The I/O circuit 16 receives signals from the external devices and provides the signals including command signals (CMD), a set of bank address signals (BA) and address signals (ADD), clock signals (CLK), and data signals (DATA) to internal circuits including a command decoder (CDEC) 17, an address buffer circuit (ADDB) 18, a clock buffer circuit (CLKB) 19, and a data control circuit (DCTL) 20, respectively. The I/O circuit 16 also receives data signals from the DCTL 20 and provides the data signals to the external devices.

The command decoder (CDEC) 17 receives the command signals (CMD) and generates corresponding control signals to read data from and write data to the memory cell array 11. The control signals include an active command signal MDBAT and a precharge command signal MDDAT provided to a row controller (RCTL) 21 and read/write (RD/WR) command signals provided to a column controller (CCTL) 22. The address buffer circuit (ADDB) 18 receives the bank address signals (BA) and the address signals (ADD) and provides row bank address information (RBA<3:0>) and row address information (RADD) to the RCTL 21, and further provides column address information (CADD) to the CCTL 22. The clock buffer circuit (CLKB) receives the CLK signals and provides internal clock signals ICLK. The DCTL 20 is a "read and write" circuitry which provides data to be written from the I/O circuit 16 to the memory cell array 11, and provides data to be read out from the memory cell array 11 to the I/O circuit 16. The CCTL 22 is a column control circuit which provides column access signals (CAC) based on the read/write (RD/WR) command signals from the CDEC 17 and the CADD from the ADDB 18. The RCTL 21 receives the active command signal MDBAT and the precharge command signal MDDAT from the CDEC 17, and the row bank address information (RBA<3:0>) and the row address information (RADD) from the ADDB 18. Based on these received signals, the RCTL 21 provides bank activation signals (MCBAT<15:0>), sense amplifier (SA) activation signals (MCSAE<15:0>) and row access signals (RAC) to the memory cell array 11. In this example, the RCTL includes a row control circuit 210 illustrated in FIG. 2A.

Figure 2A:
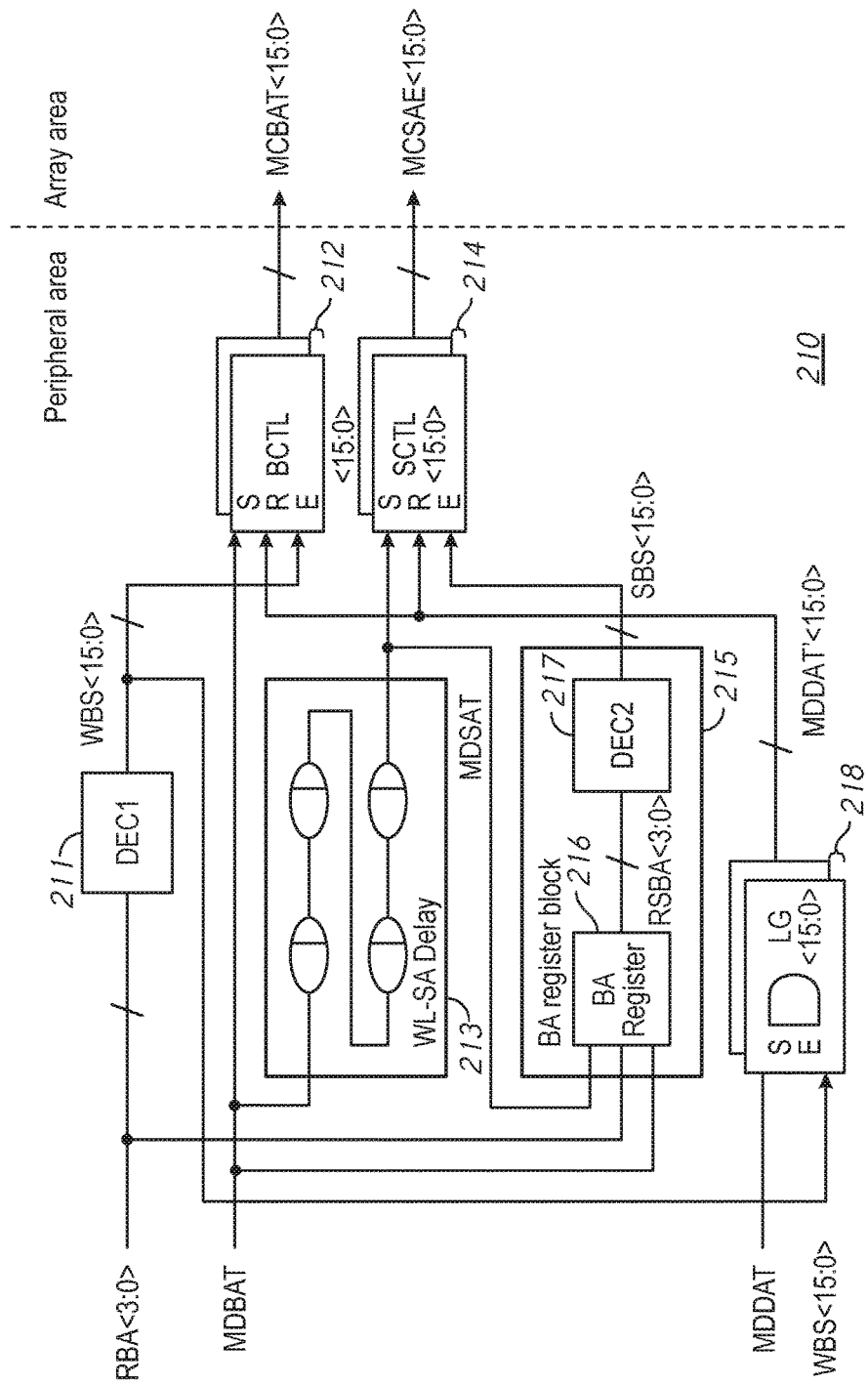
FIG. 2A is a schematic block diagram of a row control circuit according to an embodiment of the present disclosure.

FIG. 2A is a schematic block diagram of the row control circuit 210 according to an embodiment of the present disclosure. A first bank address information decoder (DEC1) 211 decodes the row bank address information RBA<3:0> which is four-bit information and provides WL bank select signals WBS<15:0>. Bank active control circuits BCTL<15:0> 212 may be flip-flop circuits where each flip-flop circuit is associated with a respective one of the memory banks 12 in FIG. 1, and where each flip-flop circuit includes a set node, a reset node and an enable node. The WBSs are provided to respective enable (E) nodes of the BCTLs<15:0> 212. A reset node of each BCTL 212 is also coupled to its respective inactivation signal MDDAT'. On the other hand, the active command signal MDBAT is provided in common to the set (S) nodes of the BCTLs <15:0> 212. The BCTLs <15:0> 212 may provide respective bank activation signals MCBAT<15:0> as active when the active command signal MDBAT and the respective WL bank select signal WBS <15:0> are indicative of being active. Activation of each WL bank select signal indicates designation of a respective memory bank. On the other hand, each bank active control circuit BCTL 212 may provide the respective bank activation signal MCBAT as inactive upon receipt of the respective inactivation signal MDDAT' without receiving the respective WBS at the enable node of each BCTL 212. Each of the bank activation signals MCBAT<15:0> may be used to define a bank activation period of a respective memory bank. In other words, each of the bank activation signals MCBAT<15:0> may be used to define a timing of controlling activation and deactivation of selected one or ones of word lines in a respective memory bank.

A WL-SA delay circuit 213 may delay the active command signal MDBAT and provide a first delayed active command signal MDSAT. In one embodiment, a delay of the WL-SA delay circuit 213 may be based on a period of time when a pair of bit lines is prepared to be sensed. In other words, the delay of the WL-SA delay circuit 213 is based on a period of time for voltages of a pair of bit lines to be separated enough responsive to a data stored in a memory cell after a word line is activated. The first delayed active command signal MDSAT is provided in common to sense amplifier control circuits SCTL<15:0> 214 as well as to a bank address (BA) register block 215 which is a first bank address control circuit.

The sense amplifier control circuits SCTL<15:0> 214 may be flip-flop circuits where each flip-flop circuit is associated with a respective one of the memory banks 12 in FIG. 1, where each flip-flop circuit includes a set node, a reset node and an enable node. Each sense amplifier control circuit SCTL 214 is substantially equal in internal operation to the bank active control circuit BCTL 212 except for input and output signals. For example, the first delayed active command signal MDSAT is provided in common to set nodes of the sense amplifier control circuits SCTL<15:0> 214. On the other hand, a reset node of each sense amplifier control circuit SCTL 214 may receive the respective inactivation signal MDDAT'. An enable node of each sense amplifier control circuit SCTL 214 may receive a respective SA bank select signal SBS from the BA register block 215. Each sense amplifier control circuit SCTL 214 may provide a respective SA activation signal MCSAE as active when the first delayed active command signal MDSAT and the respective SA bank select signal SBS are indicative of being active. Activation of each SBS indicates designation of a respective memory bank. On the other hand, each sense amplifier control circuit SCTL 214 may provide the respective SA activation signal MCSAE as inactive responsive to an assertion of the respective inactivation signal MDDAT' without receiving SBS at the enable node of each SCTL 214. The sense amplifiers in each memory bank are enabled once the sense amplifiers receive the respective SA activation signal MCSAE being active. The sense amplifiers in each memory bank are disabled once the sense amplifiers receive the respective SA activation signal MCSAE being deactivated. Thus, each SA activation signal MCSAE may be used to activate or deactivate sense amplifiers of its respective memory bank.

The BA register block 215 may include a bank address register module 216 and a second bank address information decoder (DEC2) 217. The bank address register module 216 receives the row bank address information RBA<3:0>, the active command signal MDBAT and the first delayed active command signal MDSAT and provides row sense-amp bank address information RSBA<3:0>. The bank address register module 216 will be described in details referring to FIGS. 4 and 5. The second bank address information decoder (DEC2) 217 decodes the RSBA<3:0> and provides SA bank select signals SBS<15:0>.

Each of the logic gates LG<15:0> 218 includes an AND gate which receives a respective WBS at one input node and a precharge command signal MDDAT provided to the other input node. Each logic gate of the logic gates LG<15:0> 218 may provide the respective inactivation signals MDDAT'<15:0> when the precharge command signal MDDAT and the respective WBSs<15:0> are both indicative of being active.

Figure 2B:
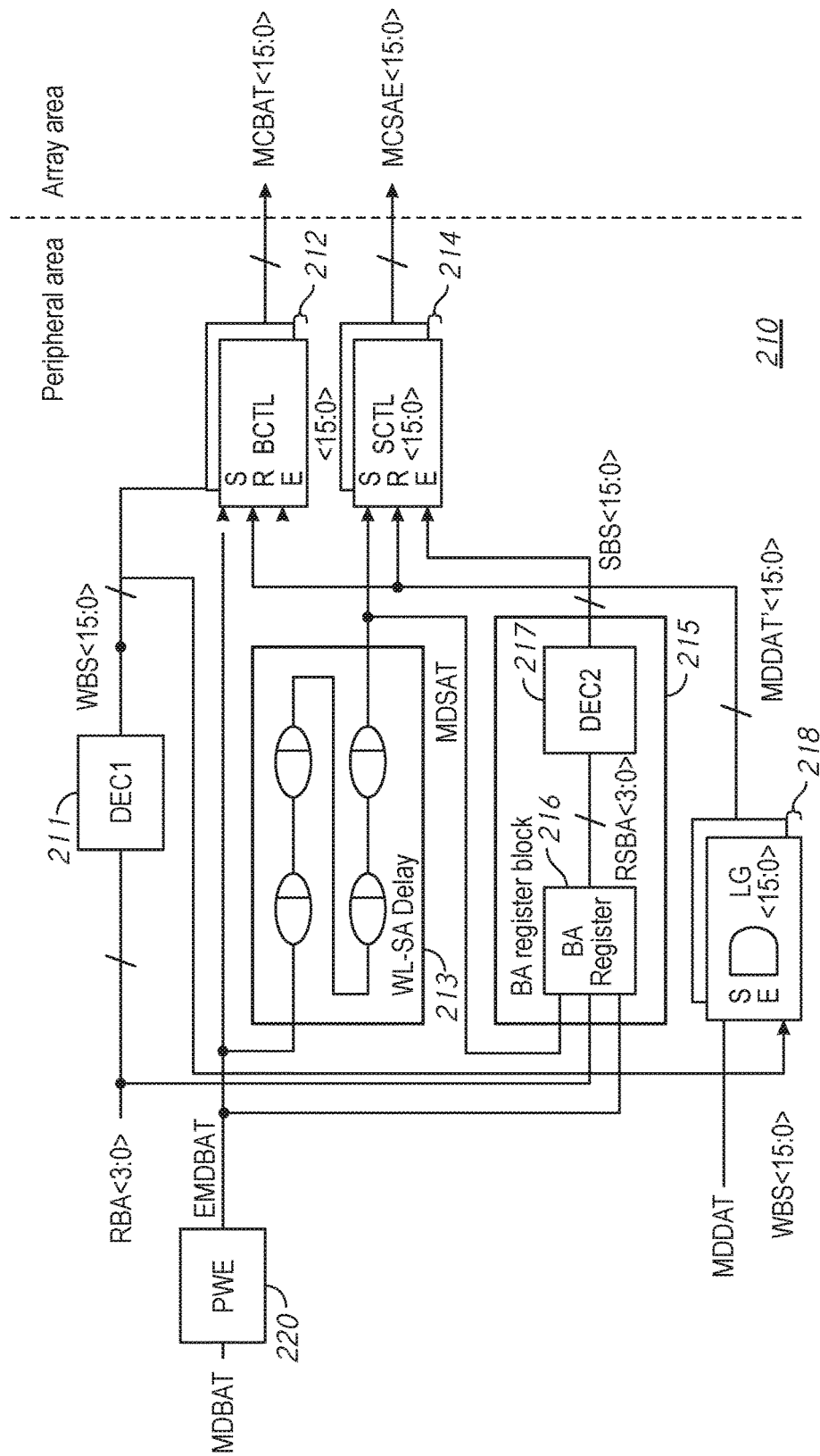
FIG. 2B is a schematic block diagram of a row control circuit according to an embodiment of the present disclosure.

FIG. 2B is a schematic block diagram of the row control circuit 210 according to an embodiment of the present disclosure. The row control circuit 210 is similar to the row control circuit 210 of FIG. 2A. Description of components in FIG. 2B corresponding to components included in FIG. 2A and previously described will not be repeated. However, in contrast to the row control circuit 210 of FIG. 2A, the row control circuit 210 of FIG. 2B may include a pulse width extension circuit PWE 220 that provides an extended active command signal EMDBAT having an extended pulse width responsive to the active command signal MDBAT. Instead of the active command signal MDBAT, the extended active command signal EMDBAT may be provided to the set (S) nodes of the BCTLs <15:0> 212, the WL-SA delay circuit 213 and the bank address register module.

Figure 2C:
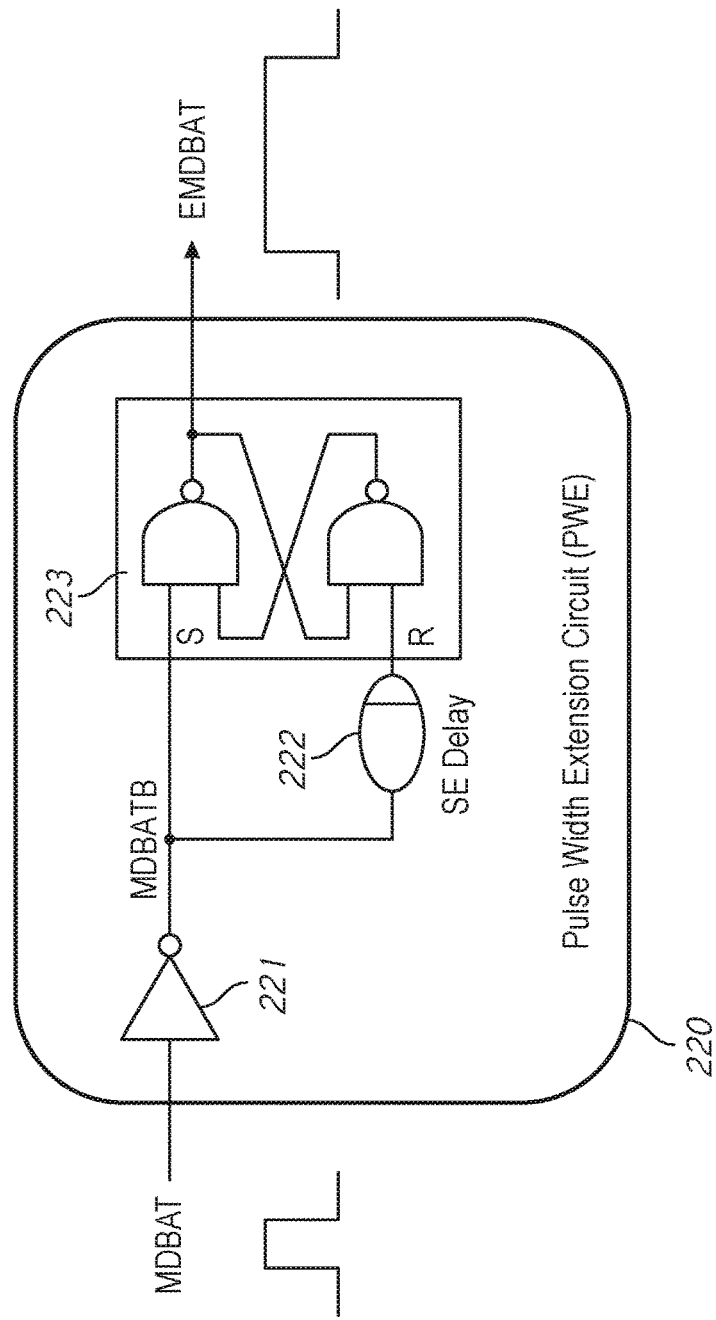
FIG. 2C is a schematic block diagram of the pulse width extension circuit in the row control circuit of FIG. 2B according to an embodiment of the present disclosure.

FIG. 2C is a schematic block diagram of the pulse width extension circuit PWE 220 in the row control circuit 210 of FIG. 2B according to an embodiment of the present disclosure. The pulse width extension circuit PWE 220 may receive the active command signal MDBAT. An inverter 221 may invert the active command signal MDBAT and may further provide an inverted active command signal MDBATB. The pulse width extension circuit PWE 220 may further include a signal extension delay circuit SED 222 that may provide a delayed MDBATB signal that has a delay relative to the MDBATB signal, where the delay is corresponding to a pulse width extension. The pulse width extension circuit PWE 220 may further include an SR latch 223 that may receive the MDBATB signal at a set (S) input and the delayed MDBATB signal at a reset (R) input and may further provide an extended active command signal EMDBAT. The EMDBAT signal may have a longer pulse width, such as a half of a minimum interval between applying an active command signal to one memory bank and applying next active command for another memory bank (tRRDmin). In comparison, the MDBAT signal may have a pulse width of approximately a half of a minimum clock cycle (tCKmin). Even if a clock cycle CK may become short, the row control circuit 210 may generate stable signals (e.g., MDSAT signal) responsive to the MDBAT signal using the EMDBAT signal having the extended pulse width.

Figure 3:
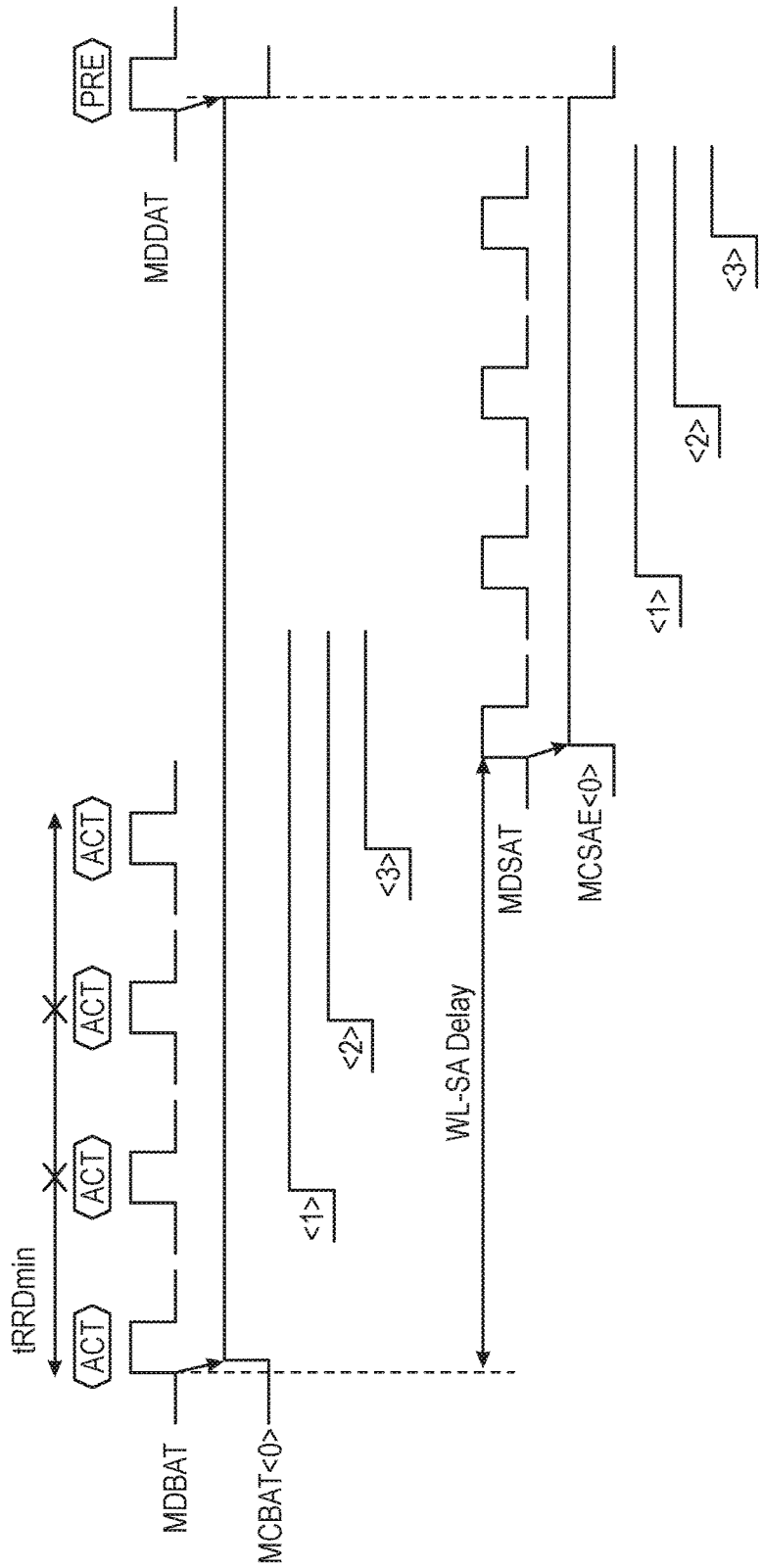
FIG. 3 is a timing diagram of signals corresponding to operations of the row control circuit according to FIG. 2A, according to an embodiment of the present disclosure.

FIG. 3 is a timing diagram of signals corresponding to operations of the row control circuit according to FIG. 2A, according to an embodiment of the present disclosure. For example, the signals in the timing diagram in FIG. 3 are active-high signals. The active command signal MDBAT has short command pulses. In FIG. 3, multiple active commands are serially issued with the minimum time interval tRRDmin. However, the interval of the active commands being issued is not limited to the tRRDmin.

In this timing diagram, MCBAT<0>, the first bank activation signal for Bank0, is activated in response to the first activation of MDBAT and provided from the BCTL<0>. MCBAT<1>, the second bank activation signal for Bank1, is activated in response to the second activation of MDBAT and provided from the BCTL<1>. MCBAT<2>, the third bank activation signal for Bank2, is activated in response to the third activation of MDBAT and provided from the BCTL<2>. The other banks follow bank activation operations in a similar manner. On the other hand, once a precharge command signal MDDAT also having short command pulses becomes active, MCBAT<0> becomes inactive in response to receipt of a first inactivation signal MDDAT'<0> for Bank0 at the BCTL<0>. The other banks follow bank deactivation operations in a similar manner.

In this embodiment, because of having the BA register block, the row control circuit can provide a WL-SA delay to the plurality of sense amplifier activation signals MCSAEs for the plurality of memory banks by using a single delay circuit, that is the WL-SA delay circuit. The first delayed active command signal MDSAT has short command pulses where the MDSAT is provided by delaying the MDBAT by the WL-SA delay circuit. In this timing diagram, MCSAE<0>, the first SA activation signal for sense amplifiers of Bank0, is activated in response to the first activation of MDSAT and provided from the SCTL<0>. MCSAE<1>, the second SA activation signal for sense amplifiers of Bank1, is also activated in response to the second activation of MDSAT and provided from the SCTL<1>. MCSAE<2>, the third SA activation signal for Bank2, is activated in response to the third activation of MDSAT and provided from the SCTL<2>. Sense amplifiers of the other banks follow SA activation operations in a similar manner. Thus, it is possible to provide delays to activation timings of sense amplifiers of each bank respectively from one WL-SA delay circuit.

Figure 4:
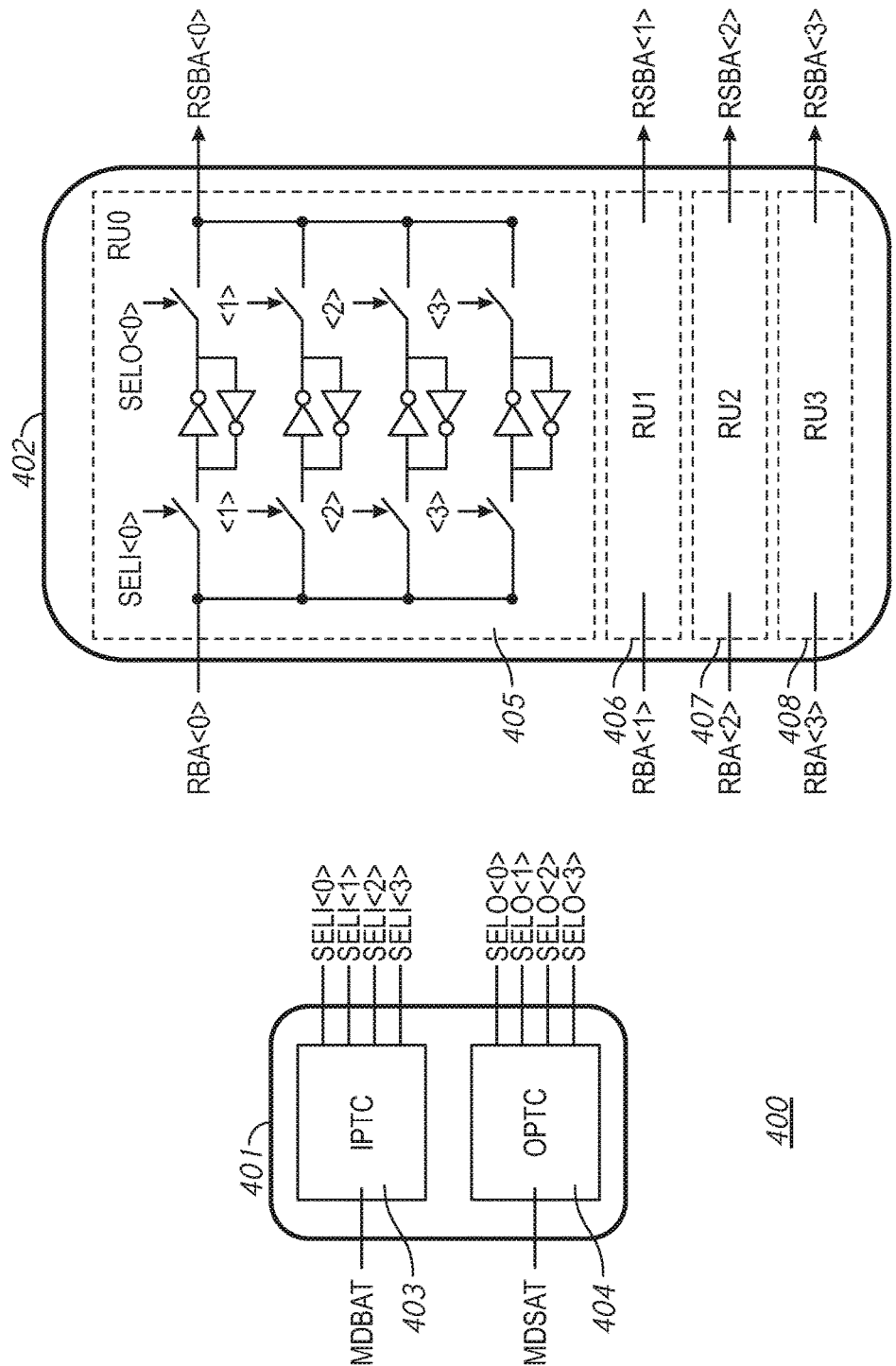
FIG. 4 is a schematic block diagram of a bank address register block in the row control circuit, according to an embodiment of the present disclosure.

FIG. 4 is a schematic block diagram of a bank address register block 400 corresponding to the BA register module 216 in the row control circuit 210, according to one embodiment of the present disclosure. The bank address register block 400 may include a register control circuit 401 and a bank address register circuit 402.

The register control circuit 401 includes an input timing control circuit (IPTC) 403 and an output timing control circuit (OPTC) 404. The IPTC 403 may selectively activate one of input control signals SELI<3:0> responsive to the active command signal MDBAT. For example, the IPTC 403 may select one of the input control signals for activation responsive to each assertion of the active command MDBAT. In one embodiment, the IPTC 403 may activate the input control signals in an order of SELI<0>, SELI<1>, SELI <2>, and SELI<3>. The OPTC 404 may substantially be the same as the IPTC 403 except that an input node of the OPTC 404 receives the first delayed active command signal MDSAT and that output nodes of the OPTC 404 provide output control signals SELO<3:0>. As a result, each output control signal SELO may be activated after a predetermined period from activation of a corresponding input control signal SELI. In one embodiment, the predetermined period may be substantially equal to a delay of the WL-SA delay circuit.

the bank address register circuit 402 may include a plurality of register units (RUs). For example, the plurality of RUs may be a first register unit (RU0) 405, a second register unit (RU1) 406, a third register unit (RU2) 407, and a fourth register unit (RU3) 408. Each RU corresponds to a respective bit of bank address information, including row bank address information (RBA) and row sense-amp bank address information (RSBA). The number of the RUs is not limited to four as shown in FIG. 4 but may depend on the number of bits of the bank address information. Each RU may include a plurality of latch circuits which function as bank address registers. Each latch circuit may latch an input signal, which is one bit of the row bank address information, responsive to assertion of the respective input control signal SELI. Each latch circuit may output the latched signal as one bit of the row sense-amp bank address information, responsive to assertion of the respective output control signal SELO. As a result, the bank register circuit 402 can apply a predetermined time of delay, which may be the same as a delay of the WL-SA delay circuit, to the bank address information. The number of latch circuits contained in each register unit RU is not limited to four as shown in FIG. 4. It is also independent of the number of the RUs. The number of latch circuits may be based on a relation between tRRDmin and the delay of the WL-SA delay circuit. For example, as the delay of the WL-SA delay circuit is longer than the tRRDmin, more latch circuits may be included.

Figure 5:
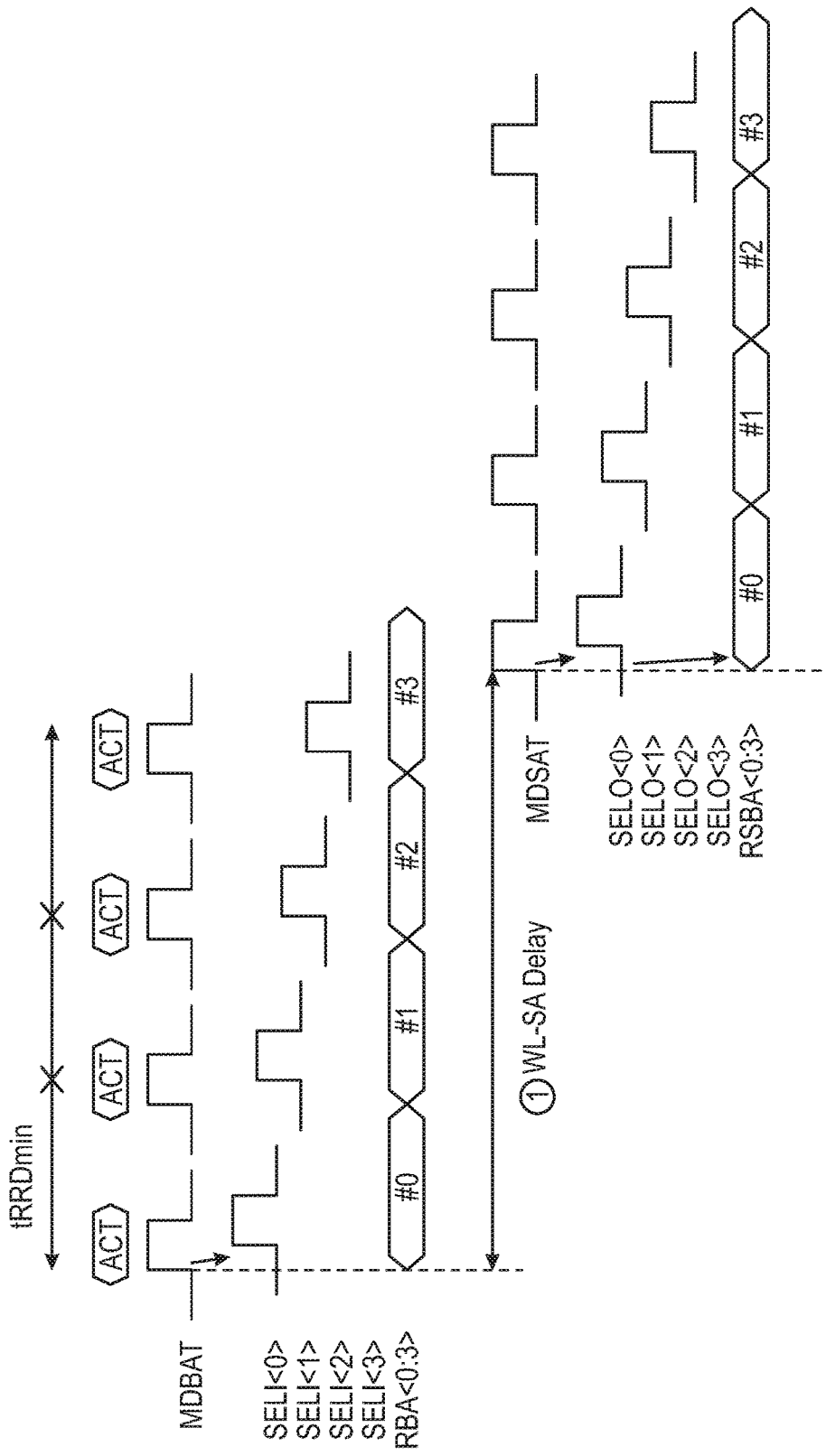
FIG. 5 is a timing diagram of signals corresponding to operations of the register control circuit in the bank address register block of FIG. 4, according to an embodiment of the present disclosure.

FIG. 5 is a timing diagram of signals corresponding to operations of the register control circuit 401 of FIG. 4, according to an embodiment of the present disclosure. For example, the signals in the timing diagram in FIG. 5 are active-high signals. The active command signal MDBAT has short command pulses. In this timing diagram, the IPTC may activate SELI<0>, the first input control signal, in response to the first activation of MDBAT and provide the activated SELI<0>, The IPTC may also activate SELI<1>, the second input control signal, in response to the second activation of MDBAT and provide the activated SELI<1>. The IPTC may also activate SELI<2>, the third input control signal, in response to the third activation of MDBAT and provide the activated SELI<2>. The other SELIs will follow activation operations in a similar manner. The first delayed active command signal MDSAT also has short command pulses. The OPTC activates SELO<0>, the first output control signal, in response to the first activation of MDSAT and provides the activated SELO<0>. The other SELOs follow activations in a similar manner and become active. In this embodiment, the register control circuit 401 may reflect the delays between activation of word lines and activation of sense amplifiers, that is the WL-SA delay, on RSBAs further processed into SA bank select (SBS) signals by using the active command signal MDBAT and the first delayed active command signal MDSAT. Thus the WL-SA delay between the MDBAT and the first delayed active command signal MDSAT can be provided to sense amplifiers on each bank.

Figure 6:
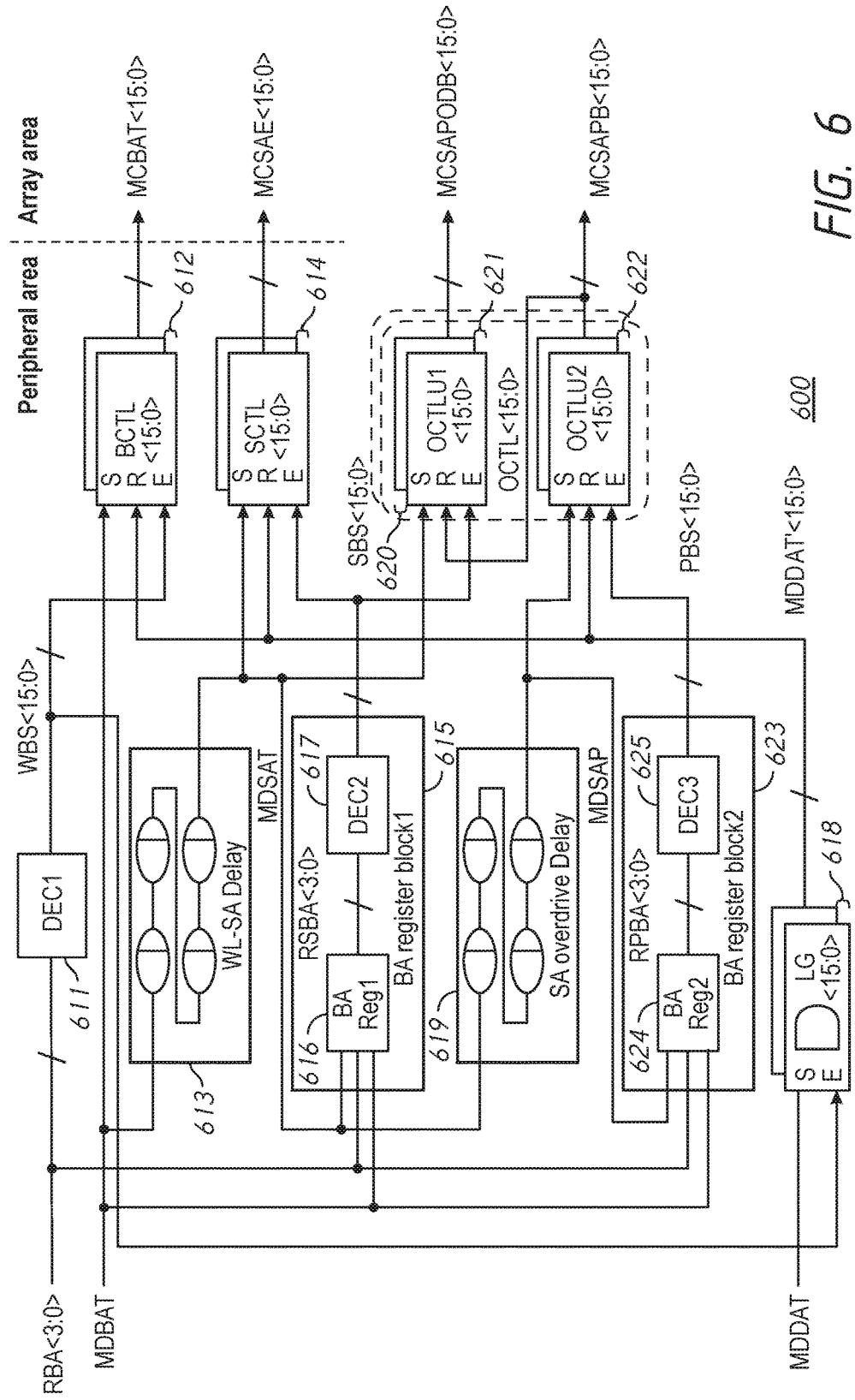
FIG. 6 is a schematic block diagram of a row control circuit, according to an embodiment of the present disclosure.

FIG. 6 is a schematic block diagram of a row control circuit 600, according to another embodiment of the present disclosure. The BA register block2 is substantially the same as the BA register block1 except for its inputs and outputs. A first bank address information decoder (DEC1) 611, Bank active control circuits BCTL<15:0> 612, a WL-SA delay circuit 613, sense amplifier control circuits SCTL<15:0> 614, a first bank address (BA) register block 615, a first bank address register module 616, a second bank address information decoder (DEC2) 617 and logic gates LG<15:0> 618 function similarly to the corresponding circuits previously described with reference to FIG. 4. Furthermore, the first delayed active command signal MDSAT may also be provided to sense amplifier overdrive control circuits OCTL<15:0> 620. The sense amplifier overdrive control circuits OCTL<15:0> 620 includes 16 OCTLs including a first OCTL<0>, a second OCTL <1>, etc.

In this embodiment, another delay circuit, a sense amplifier (SA) overdrive delay circuit 619 defines an overdrive operation period for sense amplifiers that is shared by the memory banks in a similar manner that the WL-SA delay is added. For example, the SA overdrive delay circuit 619 may receive the first delayed active command signal MDSAT from the WL-SA delay circuit 613 and provide a second delayed active command signal MDSAP. In one embodiment, a delay of the SA overdrive delay circuit 619 may be based on a period of time for a single overdrive operation for a sense amplifier. The second delayed active command signal MDSAP is provided to the sense amplifier overdrive control circuit OCTL<15:0> 620 as well as to a bank address register block2 623 which is a second bank address control circuit.

Each sense amplifier overdrive control circuit OCTL 620 controls an overdrive operation for sense amplifiers of a corresponding bank. Each sense amplifier overdrive control circuit OCTL 620 includes first overdrive control circuit units OCTLU1<15:0> 621 and second overdrive control circuit units OCTLU2<15:0> 622. The OCTLU1 621 and the OCTLU2 622 may be flip-flop circuits provided respectively to the memory banks 12 in FIG. 1, where each flip-flop circuit includes a set node, a reset node and an enable node. Thus OCTLU1 621 and OCTLU2 622 are substantially the same in internal operation to the BCTL1 612 and the SCTL1 614. The first delayed active command MDSAT is provided in common to set nodes of the first overdrive control circuit units OCTLU1<15:0> 621. Each first overdrive control circuit unit OCTLU1 621 may activate a corresponding SA overdrive control signal MCSAPODB based on the first delayed active command MDSAT from the WL-SA delay circuit 613 responsive to an assertion of a corresponding SA bank select signal SBS from the first bank address (BA) register block 615. The assertion of each SBS indicates designation of a respective memory bank. Each first overdrive control circuit unit OCTLU1 621 may deactivate the corresponding SA overdrive control signal MCSAPODB responsive to an assertion of a corresponding SA non-overdrive signal MCSAPB without receiving the corresponding SA bank select signal SBS at the enable node from the first BA register block 615.

A second bank address register block 623 may include a second bank address register module 624 and a third bank address information decoder (DEC3) 625. The second bank address register module 624 receives the row bank address information RBA<3:0>, the active command signal MDBAT and the second delayed active command signal MDSAP, and provides row overdrive bank address information RPBA<3:0>, similarly to the first bank address register module 616. The second bank address register module 624, however, uses the second delayed active command MDSAP instead of the first delayed active command MDSAT. The third bank address information decoder (DEC3) 625 decodes the RPBA<3:0> and provides overdrive (OD) bank select signals PBS<15:0>.

The second delayed active command MDSAP is also provided in common to set nodes of second overdrive control circuit units OCTLU2<15:0> 622. Each second overdrive control circuit unit OCTLU2 622 may activate a corresponding SA non-overdrive signal MCSAPB based on the second delayed active command MDSAP responsive to an assertion of a corresponding overdrive (OD) bank select signal PBS provided from the second bank address register block 623. The assertion of each PBS indicates designation of a respective memory bank. Each second overdrive control circuit unit OCTLU2 622 may deactivate the corresponding SA overdrive control signal MCSAPODB responsive to a corresponding inactivation signal MDDAT'.

Figure 7:
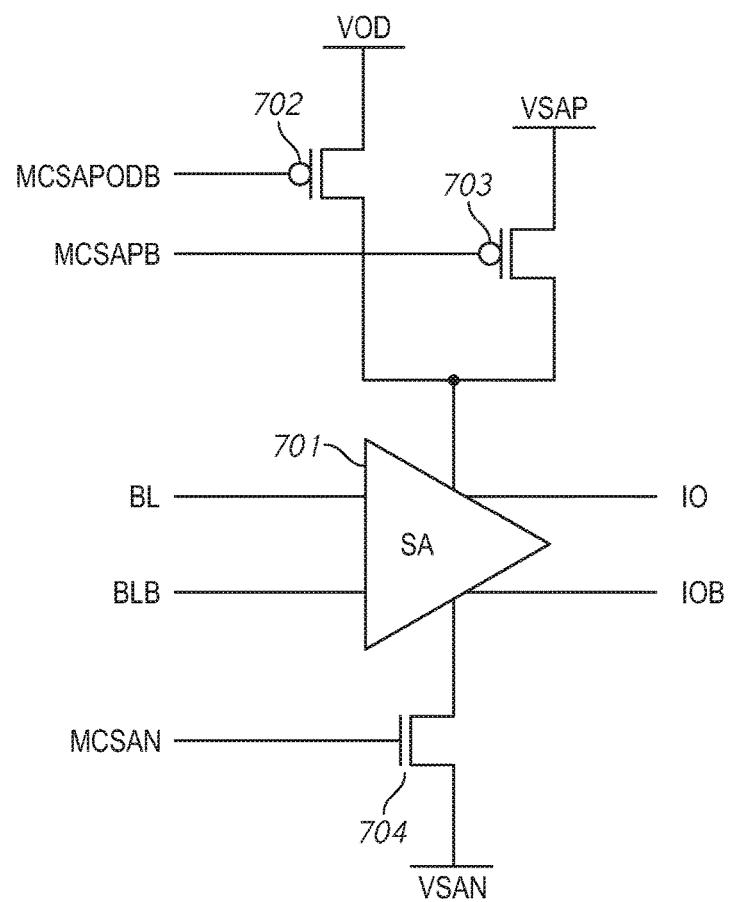
FIG. 7 is a circuit diagram of a sense amplifier according to an embodiment of the present disclosure.

Overdrive operations of sense amplifiers are executed for accelerating activation of the sense amplifiers by using applying an overdrive voltage (VOD) which is greater than a power voltage of a sense amplifier (VSAP). A circuitry relationship between the VOD and the VSAP is depicted in FIG. 7. FIG. 7 is a circuit diagram of a sense amplifier 701 corresponding with the row control circuit of FIG. 6. A source of a first p-channel transistor 702 is coupled to the VOD and a gate of the first p-channel transistor 702 is coupled to the SA overdrive control signal MCSAPODB. A source of a second p-channel transistor 703 is coupled to the VSAP and agate of the second p-channel transistor 703 is coupled to the SA non-overdrive signal MCSAPB. Drains of the first p-channel transistor 702 and the second p-channel transistors are commonly coupled to a power supply node of the sense amplifier 701. The sense amplifier 701 is coupled to a pair of bitlines providing a pair of complementary signals BL and BLB and senses a potential difference between the BL and BLB. A ground node of the sense amplifier 701 is coupled to a drain of an n-channel transistor 704 which has agate node coupled to a signal MCSAN and a source node coupled to a negative power voltage VSAN. When the SA overdrive control signal MCSAPODB is activated, the VOD is provided for accelerating activation of the sense amplifier 701. When SA non-overdrive signal MCSAPB is activated, the overdrive control signal MCSAPODB is deactivated by the OCTLU1 as well as and VSAP is provided for sensing operations of the sense amplifier 701.

Figure 8:
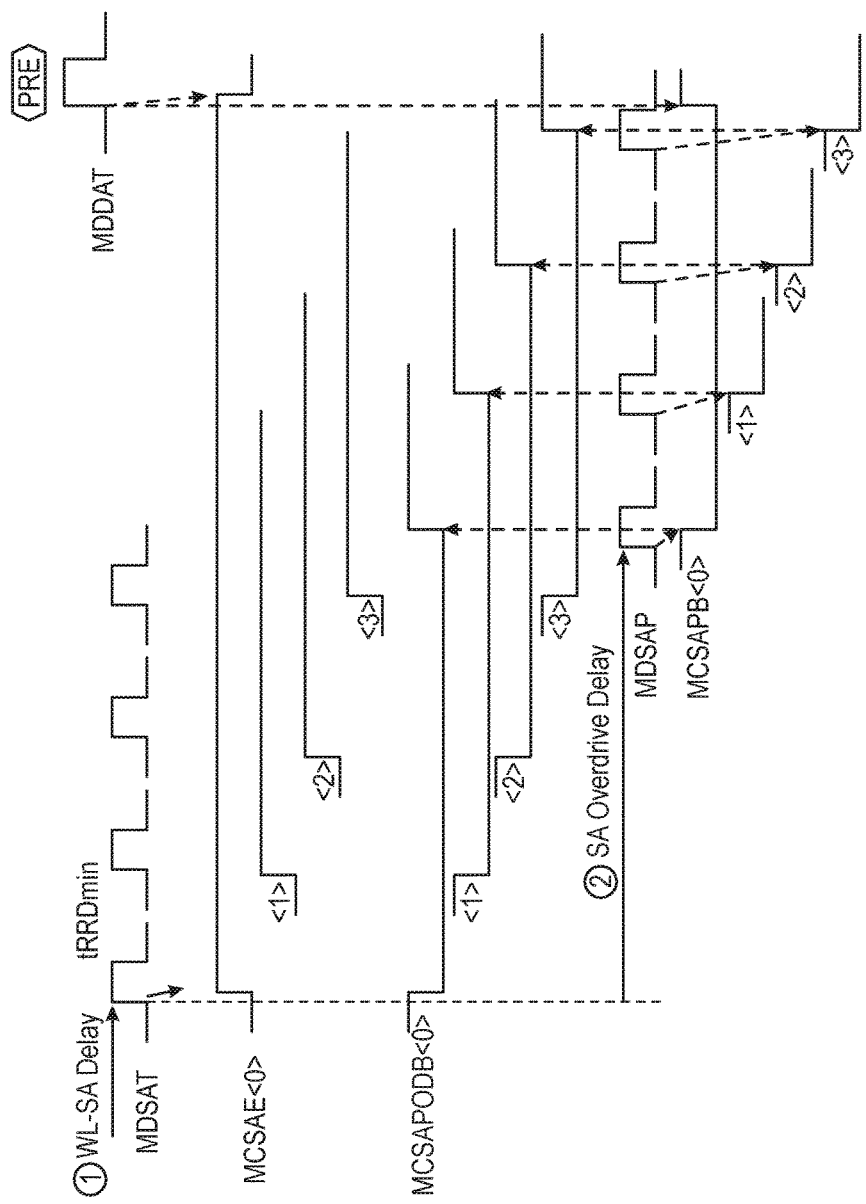
FIG. 8 is a timing diagram of signals corresponding to operations of the row control circuit of FIG. 6, according to an embodiment of the present disclosure.

FIG. 8 is a timing diagram of signals corresponding to operations of the row control circuit 600 of FIG. 6, according to an embodiment of the present disclosure. As previously described, the first delayed active command signal MDSAT has short command pulses. In this timing diagram, MCSAE<0>, the first SA activation signal for sense amplifiers of Bank0, is activated in response to the first activation of MDSAT and provided from the SCTL<0>. At the same time, the SA overdrive control signal MCSAPODB<0>, that is an active-low signal, may be activated to execute overdrive operations to accelerate the activation of the sense amplifier. The other sense amplifiers follow SA activation operations in a similar manner.

On the other hand, the second delayed active command signal MDSAP also having short command pulses becomes active with a delay of the SA overdrive delay circuit from the MDSAT. In this timing diagram, MCSAPB<0>, the first SA non-overdrive signal for sense amplifiers of Bank0, is activated in response to the first activation of MDSAP. The SA non-overdrive signal MCSAPB<0> becomes at active-low level to stop the overdrive operation for sense amplifiers of Bank0 in response to the first activation of MDSAP, by deactivating MCSAPODB<0>. The other sense amplifiers follow the overdrive deactivation operations in a similar manner at the following active periods of MDSAP. Thus, it is possible to activate an overdrive operation for sense amplifiers of each bank for period defined by the SA overdrive delay circuit.

Figure 9:
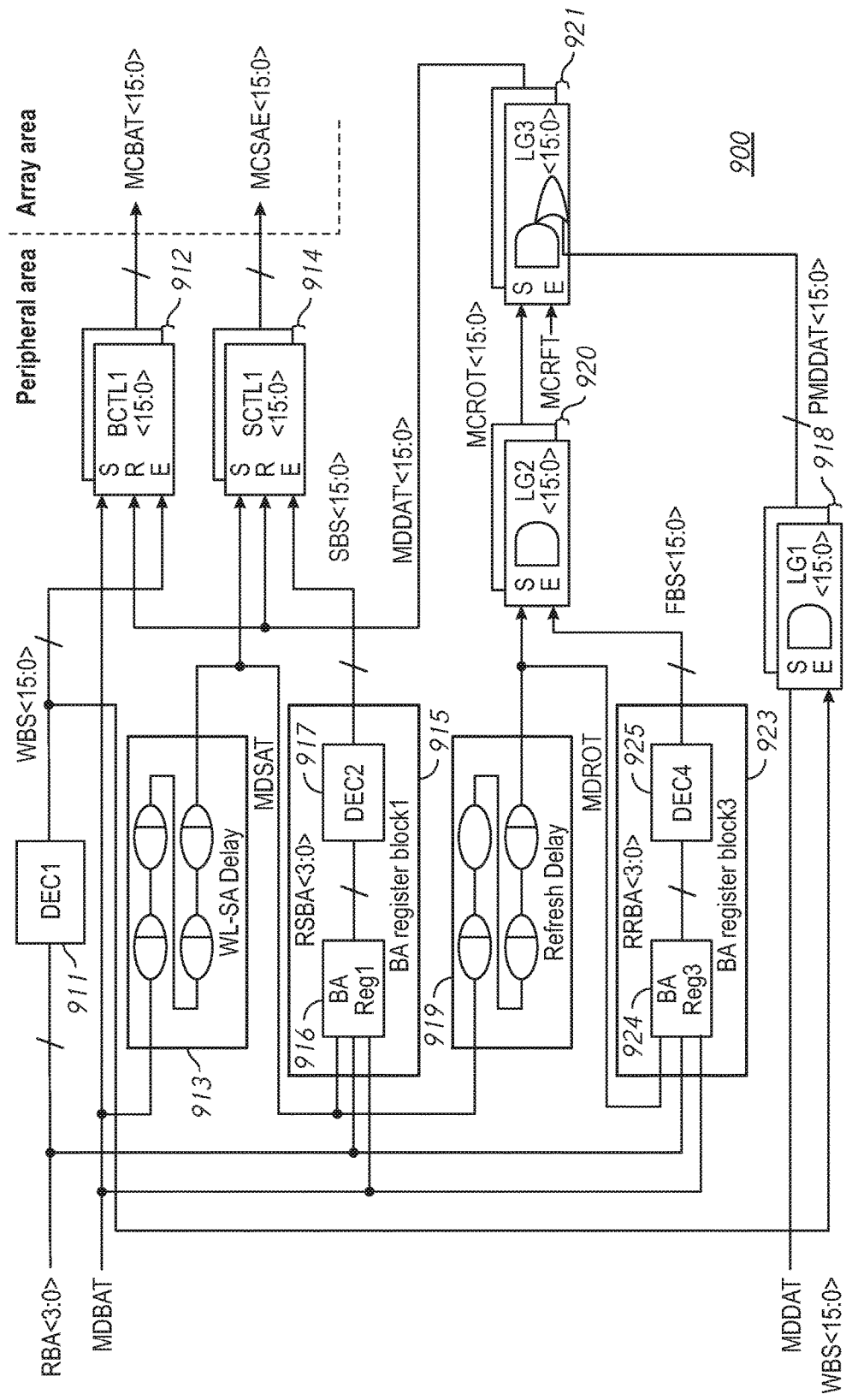
FIG. 9 is a schematic block diagram of a row control circuit, according to an embodiment of the present disclosure.

FIG. 9 is a schematic block diagram of a row control circuit 900, according to another embodiment of the present disclosure. A first bank address information decoder (DEC1) 911, Bank active control circuits BCTL<15:0> 912, a WL-SA delay circuit 913, sense amplifier control circuits SCTL<15:0> 914, the first bank address (BA) register block 915, a first bank address register module 916, a second bank address information decoder (DEC2) 917 and first logic gates LG1<15:0> 918 function similarly to the corresponding circuits as previously described with reference to FIG. 4. In this embodiment, a refresh delay circuit 919 may define a period of a single refresh operation cycle and may be shared by the memory banks in a similar manner as the WL-SA delay is shared. For example, the refresh delay circuit 919 may use a refresh delay in order to provide a third delayed active command MDROT as well as the first delayed active command signal MDSAT is provided based on the WL-SA delay. Thus, the refresh delay may be based on a period of time for a single refresh operation.

A third bank address register block 923 is substantially the same as the first bank address register block 915 except for its inputs and outputs. The third bank address register block 923 may include a third bank address register module 924 and a fourth bank address information decoder (DEC4) 925. The third bank address register module 924 receives the row bank address information RBA<3:0>, the active command signal MDBAT and the third delayed active command signal MDROT and provides row refresh bank address information RRBA<3:0>, similarly to the first bank address register module 916. The third bank address register module 924, however, uses the third delayed active command MDROT instead of the first delayed active command MDSAT. The fourth bank address information decoder (DEC4) 925 decodes the RRBA<3:0> and provides refresh (REF) bank select signals FBS<15:0>.

The third delayed active command MDROT may also be provided in common to set nodes of a plurality of second logic gates LG2 920. Each second logic gate LG2 may propagate the third delayed active command MDROT as a corresponding internal refresh end signal MCROT responsive to an assertion of a respective REF bank select signal FBS from the third bank address register block 923. The assertion of each FBS indicates designation of a respective memory bank. In a refresh operation, a plurality of third logic gates LG3<15:0> 921 receives a refresh state signal MCRFT. During refresh operations when the refresh state signal MCRFT is active, each logic gate of the third logic gates LG3<15:0> 921 may also receive corresponding internal refresh end signals MDROT<15:0> and provide inactivation signals MDDAT'<15:0>. During normal operations, such as a read operation or a write operation, when the refresh state signal MCRFT is not active, each logic gate of the third logic gates LG3<15:0> 921 may also provide the corresponding inactive signals MDDAT'<15:0> responsive to respective precharge command signals PMDDAT<15:0> received from each logic gate of the first logic gates LG1<15:0>.

Figure 10:
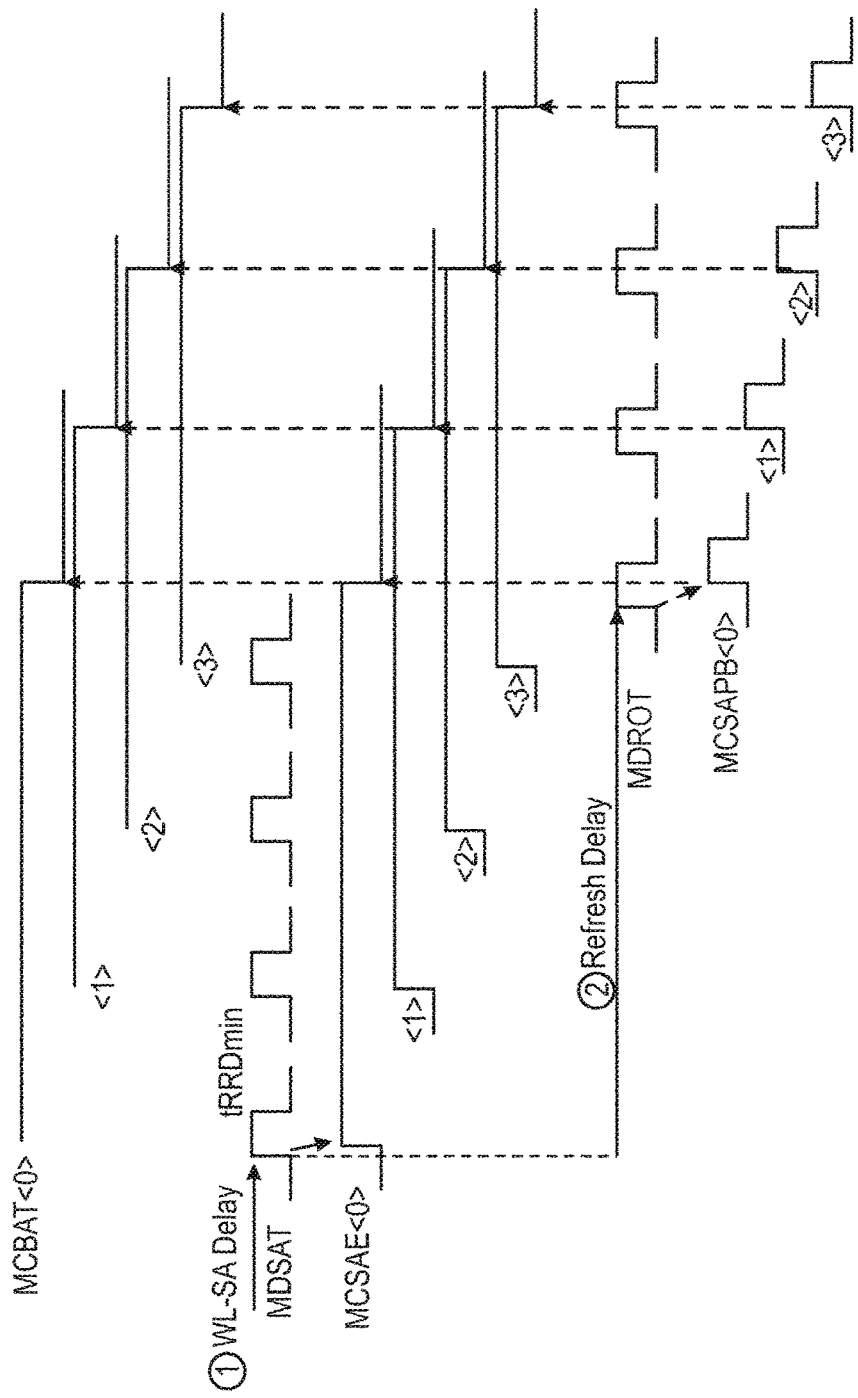
FIG. 10 is a timing diagram of signals corresponding to operations of the row control circuit of FIG. 9, according to an embodiment of the present disclosure.

FIG. 10 is a timing diagram of signals corresponding to operations of the row control circuit 900 of FIG. 9, according to an embodiment of the present disclosure. As previously described, the first delayed active command signal MDSAT becomes active and MCSAE<0>, the first SA activation signal for sense amplifiers of Bank0, is activated in response to the first activation of MDSAT and provided from the SCTL<0>. On the other hand, the third delayed active command signal MDROT also having short command pulses becomes active with a delay of the refresh delay circuit in addition to the delay from the WL-SA delay circuit. In this timing diagram, MCROT<0>, the first of third delayed active command signal also having a pulse signal for sense amplifiers of Bank0, is activated in response to the first active period of MDROT, thereby the corresponding bank activation signal MCBAT<0> and the corresponding SA activation signal MCSAE<0> are deactivated. The other sense amplifiers follow the refresh operations in a similar manner at the following active periods of MDROT. Thus, it is possible to activate a refresh operation for sense amplifiers of each bank for period defined by the refresh delay circuit.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least some of the present invention herein disclosed should not be limited by the particular disclosed embodiments described above.

What is claimed is:

1. An apparatus comprising:
   a first memory bank including at least one first sense amplifier that is configured to be enabled responsive to a first activation signal;
   a second memory bank including at least one second sense amplifier that is configured to be enabled responsive to a second activation signal; and
   a control circuit configured to receive a first control signal, the control circuit comprising:
      a first delay circuit configured to provide a first delayed control signal by delaying the first control signal,
      a first sense amplifier control circuit coupled to the first delay circuit and configured to provide the first activation signal respective to the first delayed control signal when the first memory bank is designated, and
      a second sense amplifier control circuit coupled to the first delay circuit and configured to provide the second activation signal respective to the first delayed control signal when the second memory bank is designated.

2. The apparatus as claimed in claim 1, wherein the control circuit is further configured to receive bank address information, and
   wherein the control circuit further comprises a first bank address control circuit configured to selectively activate one of the first sense amplifier control circuit and the second sense amplifier control circuit responsive to the bank address information so that a selected one of the first sense amplifier control circuit and the second sense amplifier control circuit provides a corresponding one of the first activation signal and the second activation signal to a corresponding one of the first sense amplifier and the second sense amplifier.

3. The apparatus as claimed in claim 2, wherein the bank address control circuit comprises:
   an input timing control circuit configured to selectively activate one of a plurality of input control signals responsive to the first control signal;
   an output timing control circuit configured to selectively activate one of a plurality of output control signals responsive to the first delayed control signal; and
   a plurality of bank address registers each of which is configured to latch the bank address information responsive to an activation of a respective one of the input signals and output the bank address information responsive to an activation of a respective one of the output signals.

4. The apparatus as claimed in claim 3, wherein the input timing control circuit is further configured to change activated one of the input control signal responsive to each assertion of the control signal and the output timing control circuit is further configured to change activated one of the output control signal responsive to each assertion of the delayed control signal.

5. The apparatus as claimed in claim 1, wherein the control circuit further comprises:
   a second delay circuit coupled to the first delay circuit and configured to provide a second delayed control signal by delaying the first delayed control signal;
   a first sense amplifier over drive control circuit coupled to the first delay circuit and the second delay circuit and configured to activate a first over drive control signal responsive to the first delayed control signal and inactivate the first over drive control signal responsive to the second delay control signal when the first memory bank is designated; and
   a second sense amplifier over drive control circuit coupled to the first delay circuit and the second delay circuit and configured to activate a second over drive control signal responsive to the first delayed control signal and inactivate the second over drive control signal responsive to the second delay control signal when the second memory bank is designated, and
   wherein the first sense amplifier is further configured to perform an over drive operation responsive to an activation of the first over drive control signal and further configured to stop performing the over drive operation responsive to a deactivation of the first over drive control signal, and
   wherein the second sense amplifier is further configured to perform the over drive operation responsive to an activation of the second over drive control signal and further configured to stop performing the over drive operation responsive to a deactivation of the second over drive control signal.

6. The apparatus as claimed in claim 5, wherein the control circuit is further configured to receive bank address information, the control circuit further comprises:
   a first bank address control circuit configured to selectively activate one of the first sense amplifier over drive control circuit and the second sense amplifier over drive control circuit based on the bank address information responsive to the first delayed control signal so that selected one of the first sense amplifier over drive control circuit and the second sense amplifier over drive control circuit activates a corresponding one of the first over drive control signal and the second over drive control signal; and
   a second bank address control circuit configured to selectively reset one of the first sense amplifier over drive control circuit and the second sense amplifier over drive control circuit based on the bank address information responsive to the second delayed control signal so that selected one of the first sense amplifier over drive control circuit and the second sense amplifier over drive control circuit inactivates the corresponding one of the first over drive control signal and the second over drive control signal.

7. The apparatus as claimed in claim 1, wherein the control circuit comprises:
   a second delay circuit coupled to the first delay circuit and configured to provide a second delayed control signal by delaying the first delayed control signal;
   a first reset control circuit coupled to the second delay circuit and configured to provide a first reset control signal responsive to the second delayed control signal when the first memory bank is designated; and a second reset control circuit coupled to the second delay circuit and configured to provide a second reset control signal responsive to the second delayed control signal when the second memory bank is designated, and wherein the first sense amplifier control circuit is further configured to stop providing the first activation signal responsive to the first reset control signal and the second sense amplifier control circuit is further configured to stop providing the second activation signal responsive to the second reset control signal.

8. The apparatus as claimed in claim 1, further comprising:

a command decoder configured to receive a command and further configured to provide a decoded command; and a pulse width extension circuit coupled between the command decoder and the control circuit and configured to receive the decoded command and further configured to provide the first control signal by extending a pulse width of the decoded command.

9. An apparatus comprising:

a plurality of memory banks, each memory bank of the plurality of memory banks comprises at least one sense amplifier configured to receive a sense amplifier activation signal and further configured to be activated responsive to activation of the sense amplifier activation signal, a bank control circuit configured to receive an active command signal, the bank control circuit comprising:

a wordline-sense amplifier (WL-SA) delay circuit configured to provide a WL-SA delayed active command signal;

a first bank address register block configured to receive the WL-SA delayed active command signal and bank address information corresponding to the plurality of memory banks and further configured to provide a plurality of sense amplifier bank select signals corresponding to the plurality of memory banks; and a plurality of first sense amplifier control circuits, each first sense amplifier control circuit of the plurality of first sense amplifier control circuit comprising a set node configured to receive the WL-SA delayed active command signal from the WL-SA delay circuit and an enable node configured to receive a corresponding sense amplifier bank select signal from the first bank address register block, wherein each first sense amplifier control circuit of the plurality of first sense amplifier control circuits is configured to activate the sense amplifier activation signal that is provided to the at least one sense amplifier of a corresponding one of the plurality of memory banks in response to the WL-SA delayed active command signal and the corresponding sense amplifier bank select signal.

10. The apparatus of claim 9, wherein the WL-SA delayed active command signal has a first delay from the active command signal, wherein the first delay corresponds to a period of time between when at least one word line in one of the plurality of memory banks are activated responsive to an assertion of the active command signal and when a corresponding at least one sense amplifier in the one of the plurality of memory banks is activated responsive to the assertion of the active command signal.

11. The apparatus of claim 9, wherein the bank control circuit further comprises a plurality of logic gates, wherein each logic gate of the logic gates is configured to receive a corresponding word line (WL) bank select signal designating a respective memory bank and a precharge command signal, and further configured to provide a corresponding inactivation signal, and wherein each first sense amplifier control circuit of the plurality of first sense amplifier control circuits further comprises a reset node configured to receive the corresponding inactivation signal from the corresponding logic gate and is further configured to deactivate the sense amplifier activation signal in response to the corresponding inactivation signal so as to deactivate the at least one sense amplifier of the corresponding memory bank.

12. The apparatus of claim 9, wherein each first sense amplifier control circuit of the plurality of first sense amplifier control circuits comprises at least one flip-flop circuit.

13. The apparatus of claim 9, wherein the bank control circuit further comprises:

a sense amplifier (SA) overdrive delay circuit configured to provide a SA overdrive delayed active command signal based on the WL-SA delayed active command signal;

a second bank address register block configured to receive the SA overdrive delayed active command signal and the bank address information corresponding to the plurality of memory banks and further configured to provide a plurality of overdrive (OD) bank select signals; and a plurality of sense amplifier overdrive control circuits corresponding to the plurality of memory banks, wherein each sense amplifier overdrive control circuit of the plurality of sense amplifier overdrive control circuits is configured to provide a corresponding SA overdrive control signal and a corresponding SA non-overdrive signal to deactivate the corresponding SA overdrive control signal, based on a corresponding OD bank select signal, so as to control an over drive operation of the at least one of sense amplifier of a corresponding one of the plurality of memory banks.

14. The apparatus of claim 13, wherein a power supply node of the at least one sense amplifier in each memory bank of the plurality of memory banks is coupled in common to a first transistor and a second transistor, wherein a gate node of the first transistor is coupled to the corresponding SA overdrive control signal, and wherein a gate node of the second transistor is coupled to the corresponding SA non-overdrive signal.

15. The apparatus of claim 13, wherein the SA overdrive delayed active command signal has a second delay from the active command signal, wherein the second delay is based on a period of time when the over drive operation is performed.

16. The apparatus of claim 9, wherein the bank control circuit further comprises:

a refresh delay circuit configured to provide a refresh delayed active command signal based on the WL-SA delayed active command signal;

a third bank address register block configured to receive the refresh delayed active command signal and the bank address information corresponding to the plurality of memory banks and further configured to provide a plurality of refresh bank select signals; and a plurality of sense amplifier refresh control circuits corresponding to the plurality of memory banks, wherein each sense amplifier refresh control circuit of the plurality of sense amplifier refresh control circuits is configured to receive a refresh delayed active command signal and a corresponding refresh bank select signal to provide a corresponding internal refresh end signal, and further configured to receive a refresh state signal and a corresponding precharge command signals to provide a corresponding inactivation signal so as to deactivate the at least one sense amplifier of the corresponding memory bank.

17. The apparatus of claim 16, wherein the refresh delayed active command signal has a third delay from the active command signal,
  wherein the third delay is based on a period of time for a signal refresh operation in addition to the first delay.

18. A method comprising:
  receiving an active command signal;
  providing a first delayed active command signal;
  providing a plurality of sense amplifier bank select signals, each of the plurality of sense amplifier bank select signals indicating designation of a corresponding one of a plurality of memory banks, each memory bank of the plurality of memory banks comprising at least one sense amplifier; and
  providing a plurality of sense amplifier activation signals, each of the plurality of sense amplifier activation signals being provided to the at least one sense amplifier of a respective one of the plurality of memory banks in response to the first delayed active command signal and a corresponding one of the amplifier bank select signals,
  wherein the first delayed active command signal has a delay from the active command signal corresponding to a time difference between an activation of at least one word line responsive to an assertion of the active command signal and an activation of at least one of sense amplifiers, that corresponds to the at least one word line, responsive to the assertion of the active command signal.

19. The method of claim 18, wherein providing the plurality of sense amplifier bank select signals comprises:
  receiving bank address information responsive to each assertion of the active command signal; and
  providing the bank address information responsive to each assertion of the first delayed active command signal to a decoder that is configured to provide the plurality of sense amplifier bank select signals by decoding the bank address information.

20. The method of claim 18, further comprising;
  providing a second delayed active command signal;
  providing a plurality of overdrive bank select signals, each of the plurality of sense amplifier bank select signals indicating designation of a corresponding one of a plurality of memory banks; and
  providing a plurality of sense amplifier overdrive control signals, each of the plurality of sense amplifier overdrive control signals is provided to the at least one sense amplifier of a respective one of the plurality of memory banks in response to the second delayed active command signal and a corresponding one of the plurality of overdrive hank select signals,
  wherein the second delayed active command signal has a second delay from the active command signal,
  wherein the second delay is based on a period of time for a single overdrive operation for a sense amplifier.

21. The method of claim 18, further comprising:
  providing a third delayed active command signal;
  providing a plurality of refresh bank select signals, each of the plurality of refresh bank select signals indicating designation of a corresponding one of the plurality of memory banks; and
  providing a plurality of inactivation signals, each of the inactivation signal is provided so as to inactivate a corresponding one of the plurality of memory banks in response to the third delayed active command signal and a corresponding one of the refresh bank select signals,
  wherein the third delayed active command signal has a third delay from the active command signal, and
  wherein the third delay is based on a period of time for a single refresh operation in addition to the first delay.

* * * * *